(12) United States Patent
Suzuki et al.

(10) Patent No.: US 11,463,024 B2
(45) Date of Patent: Oct. 4, 2022

(54) POWER GENERATION DEVICE

(71) Applicants: DENSO CORPORATION, Kariya (JP); TOHOKU UNIVERSITY, Sendai (JP)

(72) Inventors: Yoichiro Suzuki, Nisshin (JP); Akira Takaoka, Nisshin (JP); Takatoshi Sekizawa, Kariya (JP); Hiroki Kuwano, Sendai (JP)

(73) Assignees: DENSO CORPORATION, Kariya (JP); TOHOKU UNIVERSITY, Sendai (JP)

( * ) Notice: Subject to any disclaimer, the term of this patent is extended or adjusted under 35 U.S.C. 154(b) by 721 days.

(21) Appl. No.: 16/426,440

(22) Filed: May 30, 2019

(65) Prior Publication Data

US 2019/0280627 A1    Sep. 12, 2019

Related U.S. Application Data

(63) Continuation of application No. PCT/JP2017/041885, filed on Nov. 21, 2017.

(30) Foreign Application Priority Data

Dec. 1, 2016 (JP) .............................. JP2016-234393

(51) Int. Cl.
*H02N 2/18* (2006.01)
*H02N 2/00* (2006.01)
*B60C 23/04* (2006.01)

(52) U.S. Cl.
CPC ........... *H02N 2/186* (2013.01); *H02N 2/0055* (2013.01); *H02N 2/18* (2013.01); *B60C 23/04* (2013.01)

(58) Field of Classification Search
CPC ......... H02N 2/0055; H02N 2/18; B60C 23/04
See application file for complete search history.

(56) References Cited

U.S. PATENT DOCUMENTS

2007/0188046 A1*  8/2007  Chaillout ................. H02N 2/18
                                                          310/311
2009/0085442 A1*  4/2009  Kozinsky ............... H02N 2/188
                                                          310/339

(Continued)

FOREIGN PATENT DOCUMENTS

CN      107332469 B  *  3/2019  ............... H02N 2/18
JP      2016092888 A      5/2016

(Continued)

*Primary Examiner* — J. San Martin
(74) *Attorney, Agent, or Firm* — Harness, Dickey & Pierce, P.L.C.

(57) ABSTRACT

A power generation device is provided. A weight may vibrate in one direction as an axial direction in response to an external vibration. A beam may be arranged in at least one side with respect to the weight in the axial direction of the weight, and vibrate together with the weight. A piezoelectric element may be mounted on the beam. A guide may include a hollow guiding a movement of the weight in the axial direction. A stopper may be included in the weight. The stopper may restrict an amount of the movement of the weight in the axial direction within a predetermined amount. A stopper wall may stop the movement of the weight in the axial direction by contacting with the stopper.

10 Claims, 6 Drawing Sheets

(56) References Cited

U.S. PATENT DOCUMENTS

| | | | |
|---|---|---|---|
| 2011/0291526 A1* | 12/2011 | Abramovich | H02N 2/18 |
| | | | 290/1 R |
| 2013/0002411 A1* | 1/2013 | Henderson | H02N 2/023 |
| | | | 340/407.1 |
| 2016/0088227 A1* | 3/2016 | Ito | H02N 2/0015 |
| | | | 310/323.02 |
| 2016/0294308 A1* | 10/2016 | Chen | H02N 2/18 |
| 2019/0280627 A1* | 9/2019 | Suzuki | H01L 41/1134 |
| 2021/0237121 A1* | 8/2021 | Salzmann | G06F 3/016 |

FOREIGN PATENT DOCUMENTS

| | | | |
|---|---|---|---|
| JP | 2017051005 A | * | 3/2017 |
| JP | 2017055594 A | * | 3/2017 |
| KR | 20150066170 A | * | 6/2015 |
| WO | WO-2021075252 A1 | * | 4/2021 |

* cited by examiner

POWER GENERATION DEVICE

CROSS REFERENCE TO RELATED APPLICATIONS

The present application is a continuation application of International Patent Application No. PCT/JP2017/041885 filed on Nov. 21, 2017, which designated the United States and claims the benefit of priority from Japanese Patent Application No. 2016-234393 filed on Dec. 1, 2016. The entire disclosures of all of the above applications are incorporated herein by reference.

TECHNICAL FIELD

The present disclosure relates to a power generation device including a vibration power generation device that generates electric power in response to vibration.

BACKGROUND

A power generation device including a vibration power generation device has been proposed. The power generation device can generate electric power.

SUMMARY

A power generation device may include a weight, a stopper, and a stopper wall. The weight may vibrate in one direction as an axial direction in response to an external vibration. The stopper may be included in the weight. The stopper may restrict an amount of the movement of the weight in the axial direction within a predetermined amount. The stopper wall may stop the movement of the weight in the axial direction by contacting with the stopper.

BRIEF DESCRIPTION OF DRAWINGS

The above and other objects, features and advantages of the present invention will become more apparent from the following detailed description made with reference to the accompanying drawings. In the drawings.

DETAILED DESCRIPTION

Figure 1:
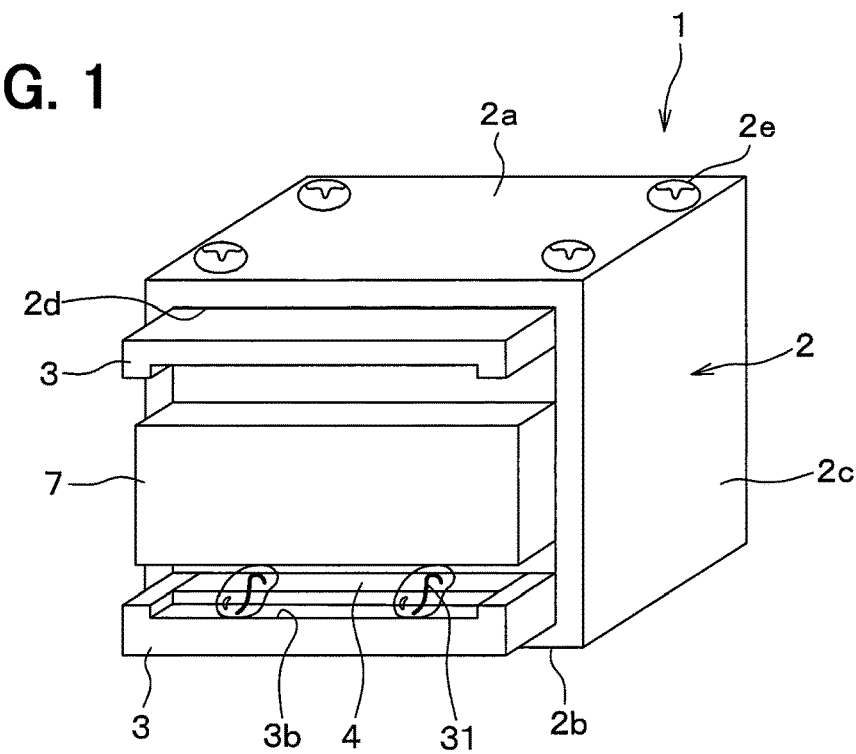
FIG. 1 is a perspective view of a power generation device according to a first embodiment.

For example, a power generation device has a structure in which a piezoelectric element is disposed on one surface of a vibrating plate having both ends each bent to form a bent portion and the bent portion is coupled to a support to support the piezoelectric element and the vibrating plate. This kind of structure causes the bent portion to serve as a vibration beam, so that the bent portion is deformed by vibration to displace the piezoelectric element disposed on the vibrating plate. This enables the power generation device to generate electric power.

To secure a certain power generation output, the bent portion is required to have a thickness of 0.01 mm or less, for example, to gain displacement of the bent portion serving as a vibration beam. The bent portion is repeatedly subjected to an impact load, so that reduction in thickness of the bent portion to gain displacement may cause insufficient strength of the bent portion. This may cause the bent portion to be torn.

An example embodiment of the present disclosure provides a power generation device capable of improving its durability performance by suppressing a tear of a beam portion to be deformed in response to external vibration.

In an example embodiment of the present disclosure, a power generation device may include a weight, a beam, a piezoelectric element, a guide, a stopper, and a stopper wall. The weight may vibrate in one direction as an axial direction in response to an external vibration. The beam may be arranged in at least one side with respect to the weight in the axial direction of the weight. The beam may have a plate shape. The beam may vibrate together with the weight. The piezoelectric element may be mounted on the beam. The piezoelectric element may be deformable in response to a deformation of the beam to generate electric power. The guide, which is opposed to a first surface of the beam, may include a hollow that houses the weight. The first surface is opposed to the weight. The hollow may guide a movement of the weight in the axial direction. The stopper may be included in the weight, and restrict an amount of the movement of the weight in the axial direction within a predetermined amount. The stopper wall may stop the movement of the weight in the axial direction by contacting with the stopper.

As described above, the beam has the plate shape. Thus, the beam is vibrated by external vibration to generate electric power with the piezoelectric element provided on the beam. While the weight is provided to increase deformation of the beam portion, the guide restricts the amount of movement of the weight to suppress excessive deformation of the beam portion. This enables a tear of the beam to be suppressed, so that durability performance can be improved.

Hereinafter, embodiments of the present disclosure will be described below with reference to accompanying drawings. Each of the embodiments below will be described by denoting the same or equivalent portions with the same reference numerals.

First Embodiment

A power generation device according to a first embodiment of the present disclosure will be described. The power generation device described below is used to be mounted in a tire mounted on a vehicle, for example, to generate electric power in accordance with rotation of the tire. For example, the power generation device is used to generate electric power for a tire-side device in a tire pressure detection system (referred to below as a Tire Pressure Monitoring System (TPMS)) of a direct type.

The TPMS of a direct type is configured such that a transmitter corresponding to the tire-side device provided with a sensor such as a pressure sensor is directly mounted in a tire and an antenna and a receiver are provided in a vehicle body. While using the configuration as described above, the TPMS causes the transmitter to transmit data including a detection result in the sensor and the receiver to receive the data including the detection result via the antenna, and then detects tire pressure by analyzing the detection result. This kind of TPMS is configured such that the transmitter is mounted in a tire where electric power supply from a battery is difficult, and thus it is desirable to provide a power generation device in the tire to supply electric power separately from the battery. The power generation device of the present embodiment can be suitably used for supplying electric power to the transmitter of the TPMS of a direct type as described above. The power generation device will be described with reference to FIGS. 1 to 4.

Figure 2:
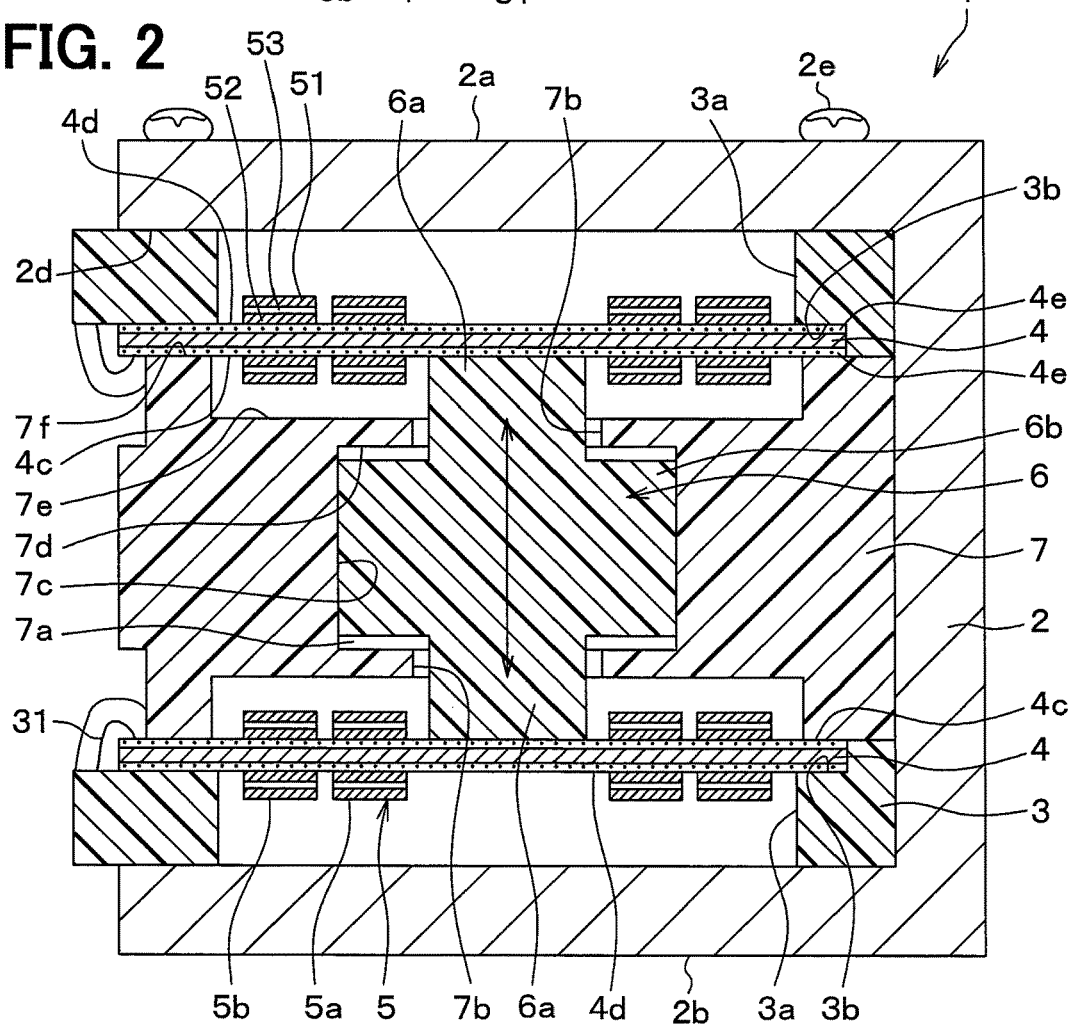
FIG. 2 is a sectional view of the power generation device illustrated in FIG. 1.
Figure 3:
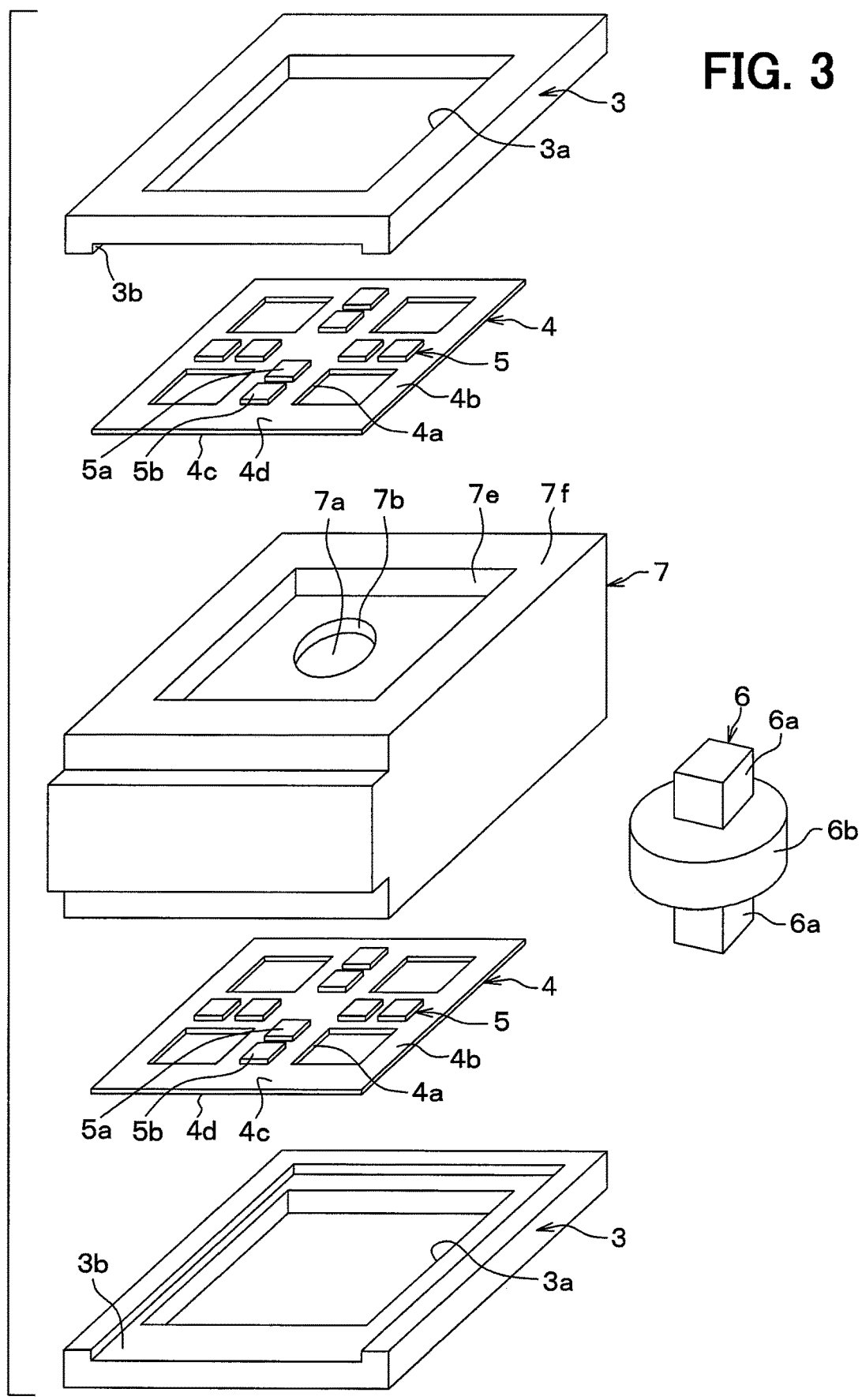
FIG. 3 is an exploded perspective view of the power generation device illustrated in FIG. 1 other than a package.

The power generation device 1 includes a package 2, a support board 3, and a beam portion 4, illustrated in FIGS. 1 to 3, along with a piezoelectric element 5, a weight portion 6, a guide portion 7, and the like, illustrated in FIGS. 2 and 3.

The package 2 is a fixing frame that includes a housing chamber for housing respective components of the power generation device 1, such as the support board 3, the beam portion 4, the piezoelectric element 5, the weight portion 6, and the guide portion 7, and that is used to fix the components in the tire. The package 2 is made of metal, resin, or the like, for example.

The package 2 has a rectangular parallelepiped shape with a hollow. In the package 2 as shown in the view of FIGS. 1 and 2, an upper surface has a rectangular shape. The package 2 has an upper surface 2a, a lower surface 2b, and lateral surfaces 2c as shown in the view of FIGS. 1 and 2. Each of the lateral surfaces 2c connects the upper surface 2a and the lower surface 2b. One of the lateral surfaces 2c has an opening. The respective components are inserted into the package 2 through the opening 2d, and their portions used for electrical connection to the outside are exposed from the opening 2d. The upper surface 2a of the package 2 is provided with a tapped hole, which is not illustrated, for fastening a screw, and the support board 3, the guide portion 7, and the like are fixed in the package 2 with a screw 2e.

One support board 3 is arranged closer to the upper surface of the package 2 than the lower surface. One support board 3 is arranged closer to the lower surface of the package 2 than the upper surface. The support board 3 is constituted by a printed circuit board, for example. On each support board 3, the beam portion 4 along with the piezoelectric element 5 is mounted, and patterns of various wires, which is not illustrated, such as extraction wires for electric power generated by the piezoelectric element 5 are formed. The support board 3 of the present embodiment has a quadrangular frame shape with a central portion formed as an opening 3a, as illustrated in FIGS. 2 and 3, and is fixed with the screws 2e at its respective four corners. The support board 3 closer to the upper surface 2a has a recessed portion 3b on a surface opposite to the upper surface 2a. The support board 3 closer to the lower surface 2b has a recessed portion 3b on a surface opposite to the lower surface 2a. The shape of the recessed portion 3b corresponds to the shape of the beam portion 4. In the recessed portion 3b, the beam portion 4 is disposed. The recessed portion 3b has a depth equivalent to a thickness of the beam portion 4. The respective components are housed in the package 2 in a state where while the beam portion 4 is disposed in the recessed portion 3b, the beam portion 4 is sandwiched between the guide portion 7 and the support board 3.

The extraction wires formed on the support board 3 are electrically connected to a first electrode 51 and a second electrode 52, provided in the piezoelectric element 5 as described below, through a bonding wire 31, and are used to extract electric current based on electromotive force generated by the piezoelectric element 5. Specifically, the support board 3 is extended outward from the package 2 through the opening 2d, and the portion extended outward from the package 2 is electrically connected to the first electrode 51 and the second electrode 52 of the piezoelectric element 5 through the bonding wire 31. Then, the portion extended outward from the package 2 is provided with an external connection pad and the like that are electrically connected to a transmitter, which is not illustrated, of the TPMS in order to enable electric power to be transmitted to the transmitter.

The support board 3 may include a rectifier circuit that rectifies output of the piezoelectric element 5, an accumulation circuit that accumulates electric power on the basis of rectified electric current, and the like. In that case, a power generation output of the piezoelectric element 5 is rectified by the rectifier circuit, and is accumulated in the accumulation circuit to be output to the outside.

The beam portion 4 is formed of a plate member, and is deformed in accordance with vibration of the weight portion 6. Two beam portions 4 are provided corresponding to respective support boards 3, and are each supported, together with the piezoelectric element 5, by the support board 3. In the present embodiment, each of the beam portions 4 is sandwiched between the corresponding one of the support boards 3 and the guide portion 7, and is supported by the support boards 3. Alternatively, each of the beam portions 4 may be supported by the corresponding one of the support boards 3 with an adhesive or the like. The beam portion 4 is made of a material allowing the beam portion 4 to be displaced in accordance with vibration of the weight portion 6, and thus is made of metal such as Stainless Steel, for example.

As illustrated in FIG. 3, the beam portion 4 of the present embodiment has a lattice shape in which a cross-shaped support portion (referred to below as a cross support portion) 4a is surrounded by a quadrangular frame portion 4b. The weight portion 6 is disposed in a central portion of the cross support portion 4a, and the quadrangular frame portion 4b is disposed in the recessed portion 3b of the support board 3. The piezoelectric elements 5 are disposed in the periphery of the central portion of the cross support portion 4a. Specifically, the piezoelectric elements 5 are disposed on one surface 4c of the beam portion 4 closer to the weight portion 6 and on another surface 4d opposite to the one surface 4c. Each of the one surface 4c and the other surface 4d is provided with an insulating film 4e and a wiring pattern, which is not illustrated. The wiring pattern is electrically connected to each portion of the piezoelectric elements 5. When the wiring pattern is connected to the bonding wire 31, a power generation output of the piezoelectric element 5 can be output to the outside.

With the support of the cross support portion 4a of the beam portion 4, the weight portion 6 is supported from four directions. The beam portion 4 may have a linear shape instead of the cross shape to allow the weight portion 6 to be disposed in a central portion thereof to form a simple both-ends support structure.

The piezoelectric element 5 is attached to the beam portion 4 by bonding or the like, and is deformed together with the beam portion 4 to generate electric power. Specifically, as illustrated in FIG. 2, the piezoelectric element 5 includes a first electrode 51, a second electrode 52, and a piezoelectric film 53 interposed between the first electrode 51 and the second electrode 52. When being deformed in accordance with vibration of the beam portion 4, each piezoelectric element 5 generates electromotive force between the first electrode 51 and the second electrode 52 due to a piezoelectric effect of the piezoelectric film 53 in accordance with displacement of the piezoelectric element 5. The piezoelectric element 5 outputs the electromotive force to the outside as a power generation output.

In the case of the present embodiment, the piezoelectric elements 5 include a first piezoelectric element 5a close to the central portion of the cross support portion 4a, and a second piezoelectric element 5b away from the central portion thereof, and each surface of the cross support portion 4a is provided with the first piezoelectric element 5a and the second piezoelectric element 5b. Thus, each beam portion 4 is provided on the one surface 4c and the other surface 4d with four first piezoelectric elements 5a and four second piezoelectric elements 5b.

Figure 4:
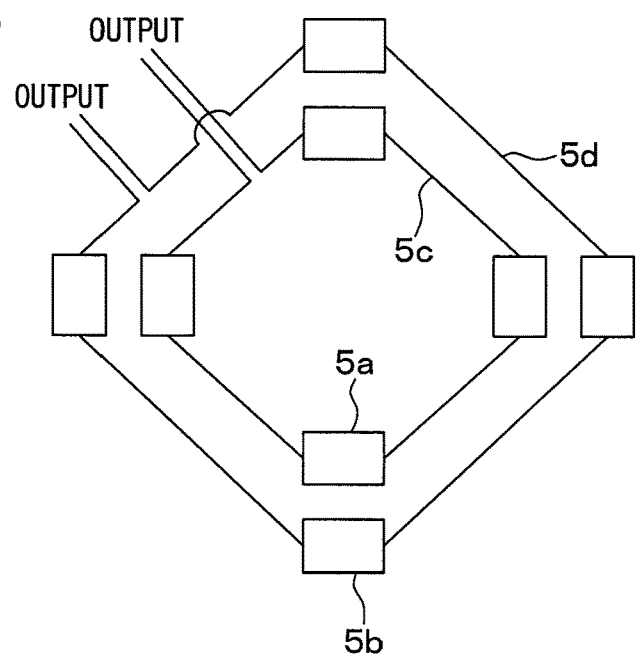
FIG. 4 is a schematic circuit diagram illustrating an electrical connection structure of piezoelectric elements.

The first electrode 51 and the second electrode 52 of each first piezoelectric element 5a are electrically connected to respective different wiring patterns formed in the beam portion 4. Likewise, the first electrode 51 and the second electrode 52 of each second piezoelectric element 5b are electrically connected to respective different wiring patterns formed in the beam portion 4. That is, as illustrated in FIG. 4, there are provided a wiring pattern 5c connected to the first electrode 51 of each first piezoelectric element 5a, and a wiring pattern 5d connected to the first electrode 51 of each second piezoelectric element 5b. Then, a total output of the respective first piezoelectric elements 5a and a total output of the respective second piezoelectric elements 5b can be output to the outside through each of the wiring patterns 5c, 5d.

For example, displacement of the beam portion 4 in a place where each first piezoelectric element 5a is disposed close to the central portion of the cross support portion 4a is opposite to displacement thereof in a place where the second piezoelectric element 5b is disposed away from the central portion thereof, so that compression stress and tensile stress are conversely applied to each of the places. This causes a total output of the respective first piezoelectric elements 5a and a total output of the respective second piezoelectric elements 5b to have an inverse relation, so that the rectifier circuit rectifies the total outputs to apply the same plus or minus sign to the total outputs. After the same plus or minus sign is applied to the total outputs, the total outputs are combined to be transmitted to the extraction wires of the support board 3. Alternatively, the accumulation circuit accumulates electric power on the basis of each of the total outputs after rectification. This enables the total output of the respective first piezoelectric elements 5a and the total output of the respective second piezoelectric elements 5b to be output to the outside, and also output acquired by combining the total outputs can be output to the outside.

The weight portion 6 serves as a weight for increasing vibration of the beam portion 4. The weight portion 6 has a center axis in a vibration direction of the beam portion 4, being a center line of the one surface 4c and the other surface 4d in a normal direction thereof. As illustrated in FIGS. 2 and 3, the weight portion 6 includes protrusions 6a formed at both ends in its axial direction, and an expansion portion 6b positioned inward of the protrusions 6a, being radially expanded in size. In the present embodiment, each of the protrusions 6a is in a quadrangular prismatic shape, and the expansion portion 6b is in a cylindrical columnar shape. Each of the protrusions 6a has the same protrusion height from the expansion portion 6b. Each of the protrusions 6a is brought into contact with the one surface 4c of the corresponding one of the beam portions 4 at its leading surface, or is bonded to the one surface 4c thereof, so that each of the beam portions 4 is also vibrated in accordance with vibration of the weight portion 6. In the case of the present embodiment, the expansion portion 6b serves as a part of a stopper portion, and is brought into contact with a stopper wall 7d of the guide portion 7 described below to restrict the amount of vibration of the weight portion 6 in its axial direction.

The guide portion 7 guides axial movement of the weight portion 6, and also serves as a stopper member for restricting the amount of the axial movement in the case of the present embodiment. The guide portion 7 is composed of two members, for example, and is in a quadrangular prismatic shape as a whole, having a size allowing it to be housed in the package 2 and corresponding to that of an outer shape of the support board 3. The guide portion 7 is provided in its central portion with a hollow portion 7a in which the weight portion 6 is housed. The hollow portion 7a is in a shape corresponding to that of the weight portion 6. The guide portion 7 and the hollow portion 7a each have a center axis coaxial with the center axis of the weight portion 6.

Specifically, the hollow portion 7a is provided so as to pass through opposite axial surfaces of the guide portion 7. Each opening 7b is formed on a surface in the axial direction, that is, on the surface that faces the beam portion 4 and corresponds to the protrusion 6a of the weight portion 6. A hollow expansion portion 7c expanded in inner diameter to correspond to an outer diameter of the expansion portion 6b is formed inside the guide portion 7 and closer to the center of the guide portion 7 than the openings 7b. The hollow expansion portion 7c has a dimension in an axial direction larger than a dimension in the axial direction of the expansion portion 6b to enable the expansion portion 6b to be moved in the axial direction. Then, the amount of axial movement of the weight portion 6 can be restricted by bringing the expansion portion 6b into contact with one of wall surfaces at both ends of the hollow expansion portion 7c being provided with respective openings 7b, serving as the stopper wall 7d, when the weight portion 6 is vibrated.

The amount of movement of the weight portion 6, or the amount of deformation of the beam portion 4, is designed to be a predetermined amount or less so that a stress to be applied to the beam portion 4 in the power generation device 1 in use is equal to or less than a rupture stress of the beam portion 4. This enables a tear of the beam portion 4 to be suppressed, so that durability performance of the power generation device 1 can be improved.

The guide portion 7 is provided in its inner edge portion in each of opposite ends surface in the axial direction with a recessed portion 7e to form a protrusion 7f in its outer edge portion. The beam portion 4 is disposed so as to be sandwiched between the protrusion 7f and the support board 3, so that the piezoelectric elements 5 provided on the one surface 4c of the beam portion 4 is disposed in the recessed portion 7e. The recessed portion 7e have a depth designed to prevent the piezoelectric elements 5 provided on the one surface 4c from colliding with a bottom surface of the recessed portion 7e even when the beam portion 4 is vibrated. That is, a clearance between the stopper wall 7d and the expansion portion 6b in the hollow expansion portion 7c is less than a clearance from the bottom surface of the recessed portion 7e to the piezoelectric elements 5 provided on the one surface 4c.

The guide portion 7 may be split by any way as long as it is split to allow the weight portion 6 to be housed in the hollow portion 7a. For example, there is available a structure in which the guide portion 7 is split along a radial surface in the axial direction of the hollow portion 7a. As an example, there is available a structure in which the guide portion 7 is laterally split in FIG. 2. There is also available a structure in which a surface with a normal direction in the axial direction of the guide portion 7 is a splitting surface, that is, the guide portion 7 is vertically split in FIG. 2.

The power generation device 1 according to the present embodiment is configured as described above. The power generation device 1 as described above is bonded to a back surface of a tread of a tire, for example. When the power generation device 1 generates electric power using force of the tire in a centrifugal direction, for example, the lower surface 2b of the package 2 is bonded to the back surface of the tread of the tire. When the power generation device 1 generates electric power using force in a rotation direction of the tire, that is, a tangential direction of the tire one of the lateral surfaces 2c of the package 2 other than the opening 2d, for example, a surface facing the opening 2d is bonded to the back surface of the tread of the tire.

Subsequently, operation of the power generation device 1 according to the present embodiment will be described in association with operation of the TPMS.

When the tire is rotated, the force of the tire in the centrifugal direction or force thereof in the rotation direction causes the weight portion 6 to vibrate. The beam portion 4 is vibrated in accordance with the vibration of the weight portion 6 to be deformed. Then, the piezoelectric elements 5 are also deformed in accordance with the deformation of the beam portion 4. At this time, the weight portion 6 provided serves as a weight to enable increase in the amount of deformation of the beam portion 4 and the piezoelectric elements 5.

Then, the deformation of each of the piezoelectric elements 5 at this time causes electromotive force to be generated between the first electrode 51 and the second electrode 52 of each of the piezoelectric elements 5 due to a piezoelectric effect of the piezoelectric film 53 provided in each of the piezoelectric elements 5. This enables a total output of the respective first piezoelectric elements 5a and a total output of the respective second piezoelectric elements 5b to be acquired. Each of the total outputs is directly output to the outside through the extraction wires, or is rectified by the rectifier circuit and accumulated in the accumulation circuit as electric power, and then is output to the outside as the electric power accumulated, for example.

This causes a power source to be generated by using the accumulation circuit (not illustrated) in the transmitter of the TPMS, accumulating electric power on the basis of each of the total outputs, or an accumulation circuit provided in the power generation device 1. Then, a microcomputer of the transmitter of the TPMS is driven, and pressure is detected by a pressure sensor provided in the transmitter, by using the power source. The microcomputer applies signal processing to the detection result of pressure to create data including the detection result. After that, when a predetermined transmission cycle starts, the data including the detection result is transmitted with wireless communication on the basis of electric power from the power source. When the receiver receives the data through the antenna provided in the vehicle body, the data received by the receiver is analyzed to detect tire pressure.

As described above, the power generation device 1 of the present embodiment is configured such that the beam portion 4 is formed of a plate member, and the beam portion 4 is vibrated by external vibration to generate electric power with the piezoelectric elements 5 provided on the beam portion 4. While the weight portion 6 is provided to increase deformation of the beam portion 4, the guide portion 7 restricts the amount of movement of the weight portion 6 to suppress excessive deformation of the beam portion 4. This enables a tear of the beam portion 4 to be suppressed, so that durability performance can be improved.

The guide portion 7 sets a movement direction of the weight portion 6 to allow the weight portion 6 to move in the axial direction even in environment with various external vibrations, so that movement of the weight portion 6 is restricted for vibration other than vibration in a desired direction. This enables the beam portion 4 to be prevented from being subjected to excessive stress in a direction different from the axial direction of the weight portion 6, so that a rupture of the beam portion 4 can be further suppressed.

The expansion portion 6b of the weight portion 6 collides with the stopper wall 7d to stop the weight portion 6 moving in the axial direction. This stops deformation of the beam portion 4 to enable the beam portion 4 to have no collision portion. As described above, the weight portion 6 with high strength receives an impact load, so that a rupture of the beam portion 4 can be further suppressed to enable durability thereof to be further improved.

In the present embodiment, two beam portions 4 are provided across one weight portion 6 to deform the two beam portion 4 using vibration of the one weight portion 6. This enables a double power generation output to be acquired as compared with the case where one beam portion 4 is deformed by one weight portion 6. In addition, in a structure in which the weight portion 6 is disposed for one beam portion 4, a leading end of the weight portion 6, on a side opposite to the beam portion 4, is free, so that the weight portion 6 may be vibrated in a direction other than the axial direction. In contrast, the structure in which the weight portion 6 is sandwiched by the two beam portions 4 enables vibration of the weight portion 6 in a direction other than the axial direction to be further suppressed. Thus, spring stiffness of the beam portion 4 against a vibration component of the weight portion 6 in a direction other than the axial direction can be increased, and contact abrasion between the guide portion 7 and the weight portion 6 can be reduced to enable also abrasion durability thereof to be improved.

Second Embodiment

A second embodiment will be described. The present embodiment is different from the first embodiment in structure of a weight portion 6 and a guide portion 7, and is similar to the first embodiment in the other portions. Thus, only portions different from those of the first embodiment will be described.

Figure 5:
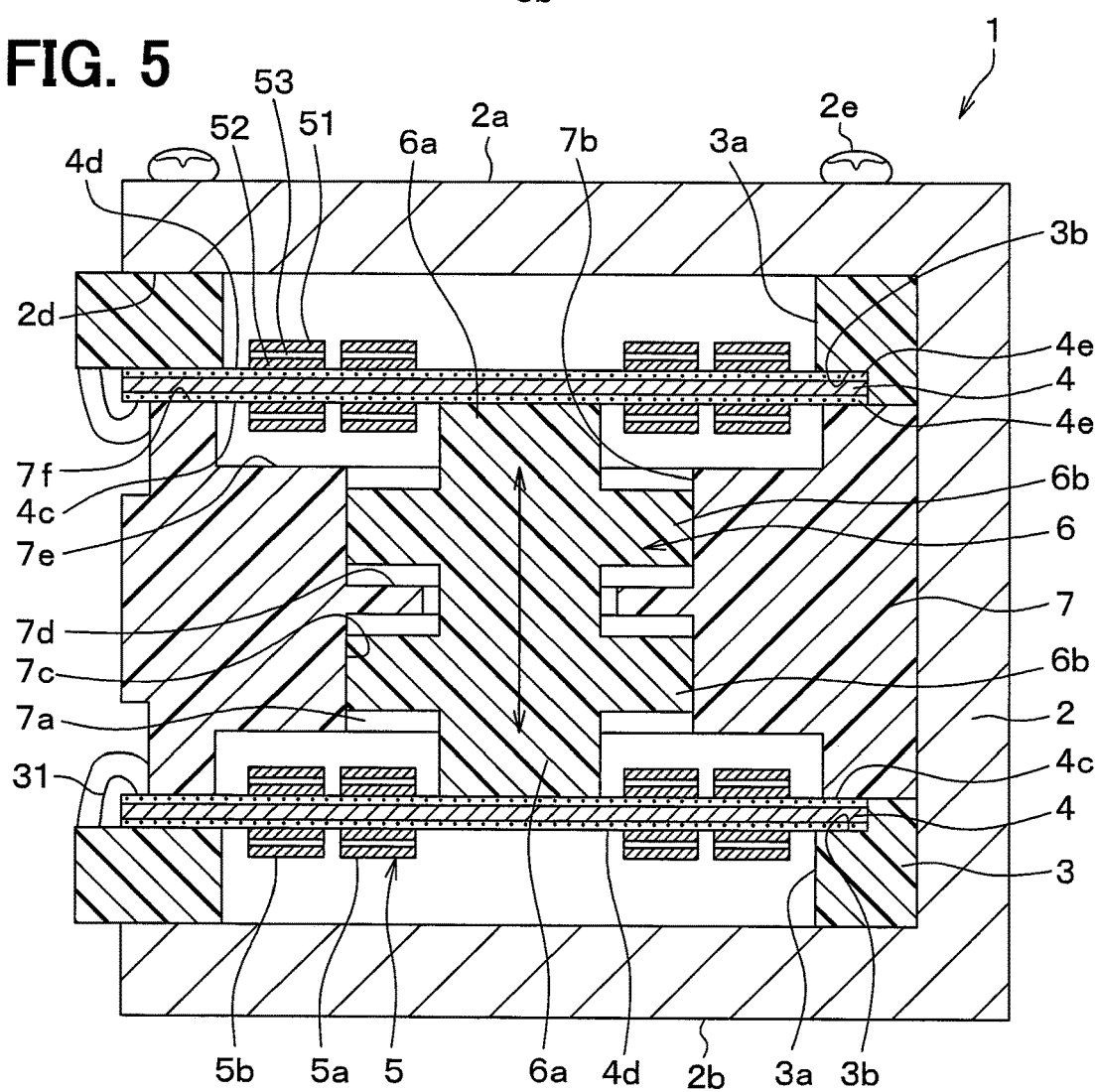
FIG. 5 is a sectional view of a power generation device according to a second embodiment.

As illustrated in FIG. 5, two expansion portions 6b are provided in the weight portion 6 in the present embodiment. Then, while the guide portion 7 is provided with a hollow portion 7a, a hollow expansion portion 7c is not provided inside the guide portion 7, inward of an opening 7b. There is provided a stopper wall 7d reduced in inner diameter.

Even the structure in which the stopper wall 7d is disposed between the expansion portions 6b as described above enables achieving a similar effect to that of the first embodiment.

Third Embodiment

A third embodiment will be described. The present embodiment is different from the first embodiment in structure of a weight portion 6 and a guide portion 7 together with a structure of a stopper, and is similar to the first embodiment in the other portions. Thus, only portions different from those of the first embodiment will be described.

Figure 6:
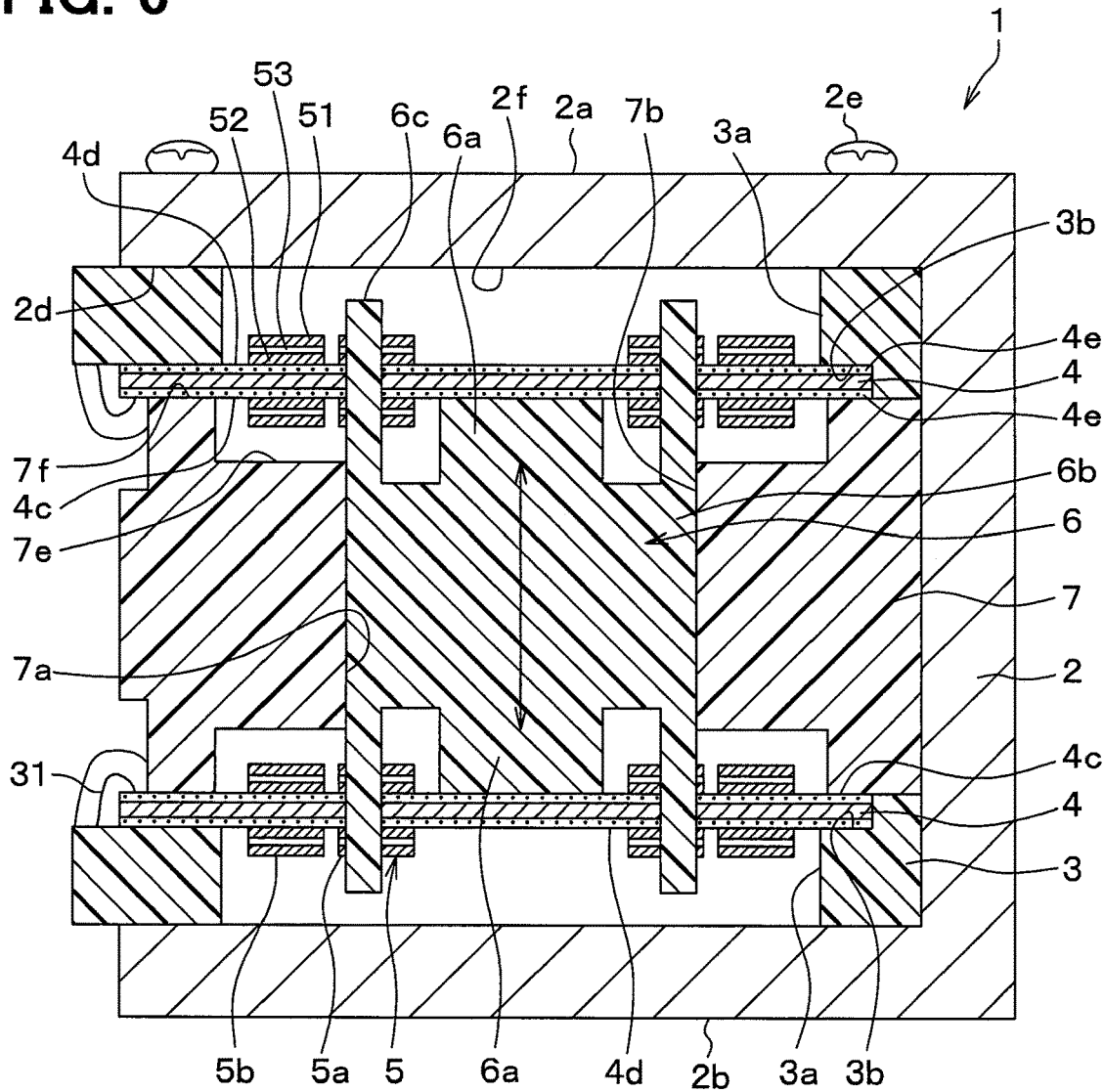
FIG. 6 is a sectional view of a power generation device according to a third embodiment.
Figure 7:
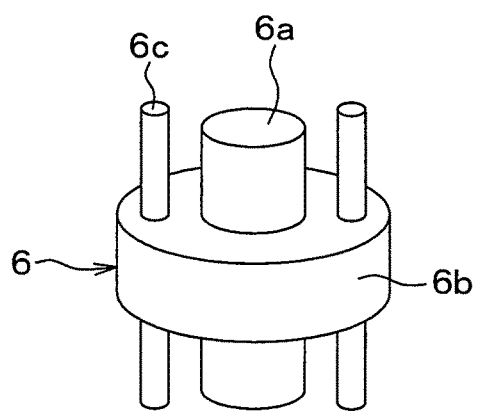
FIG. 7 is a perspective view of a weight portion included in the power generation device illustrated in FIG. 6.

As illustrated in FIGS. 6 and 7, in the present embodiment, a hollow portion 7a of the guide portion 7 is in a simple cylindrical columnar shape with an inner diameter corresponding with an outside dimension of an expansion portion 6b, and the guide portion 7 is provided with no stopper. Alternatively, the weight portion 6 is provided with a plurality of stopper portions 6c. The stopper portions 6c are each formed so as to project from the expansion portion 6b, along the axial direction of the weight portion 6. The stopper portions 6c pass through the corresponding four holes defined by a cross support portion 4a and a quadrangular frame portion 4b of each of beam portions 4 to project toward an upper surface 2a and a lower surface 2b of a package 2. Then, a leading end of each of the stopper portions 6c is brought into contact with the corresponding one of inner walls of the package 2, serving as stopper walls 2f, to restrict the amount of movement of the weight portion 6.

Even the structure in which the stopper portions 6c are brought into contact with the corresponding stopper walls 2f of the package 2 to restrict the amount of movement of the weight portion 6 as described above enables achieving a similar effect to that of the first embodiment.

Fourth Embodiment

A fourth embodiment will be described. The present embodiment is different from the first to third embodiments in structure of a weight portion 6, and is similar to the first to third embodiments in the other portions. Thus, only portions different from those of the first to third embodiments will be described. While the case of applying the structure of the present embodiment to the structure of the first embodiment will be described here, a similar structure also can be applied to the second and third embodiments.

Figure 8:
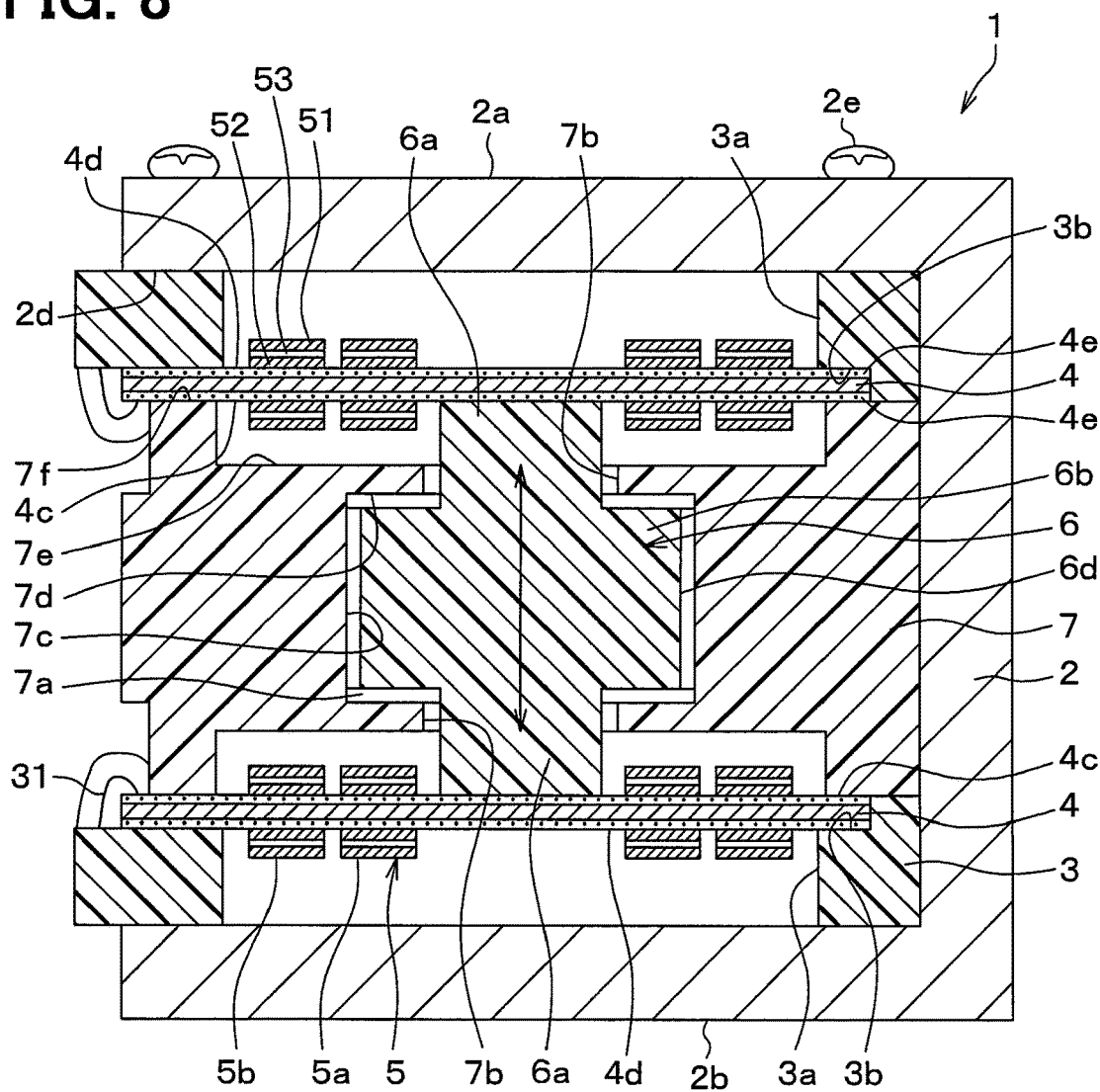
FIG. 8 is a sectional view of a power generation device according to a fourth embodiment.
Figure 9:
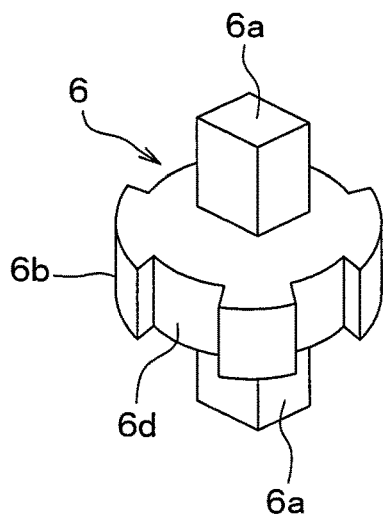
FIG. 9 is a perspective view of a weight portion included in the power generation device illustrated in FIG. 8.

As illustrated FIGS. 8 and 9, in the present embodiment, there are provided communication passages 6d in respective spaces across an expansion portion 6b of the weight portion 6 in a hollow portion 7a such that the spaces communicate axially with each other. Here, the expansion portion 6b is provided in its lateral surface with grooves to form the respective communication passages 6d. While the number of the communication passages 6d is arbitrary, it is preferable to form the communication passages 6d to be rotational symmetry about a center axis of the weight portion 6 in consideration of weight balance of the weight portion 6 about the center axis.

When the expansion portion 6b is axially moved along an inner wall of the guide portion 7, air may serve as a damper to interfere with vibration of the weight portion 6. In contrast, when the communication passages 6d are provided, both spaces across the expansion portion 6b communicate with each other to move air smoothly. This prevents the air from serving as a damper. Thus, when the communication passages 6d as in the present embodiment are provided, interference of vibration of the weight portion 6 can be suppressed to enable the power generation device 1 to have favorable power generation efficiency.

Fifth Embodiment

A fifth embodiment will be described. The present embodiment is different from the first to third embodiments in structure of a guide portion 7, and is similar to the first to third embodiments in the other portions. Thus, only portions different from those of the first to third embodiments will be described. While the case of applying the structure of the present embodiment to the structure of the first embodiment will be described here, a similar structure also can be applied to the second and third embodiments.

Figure 10:
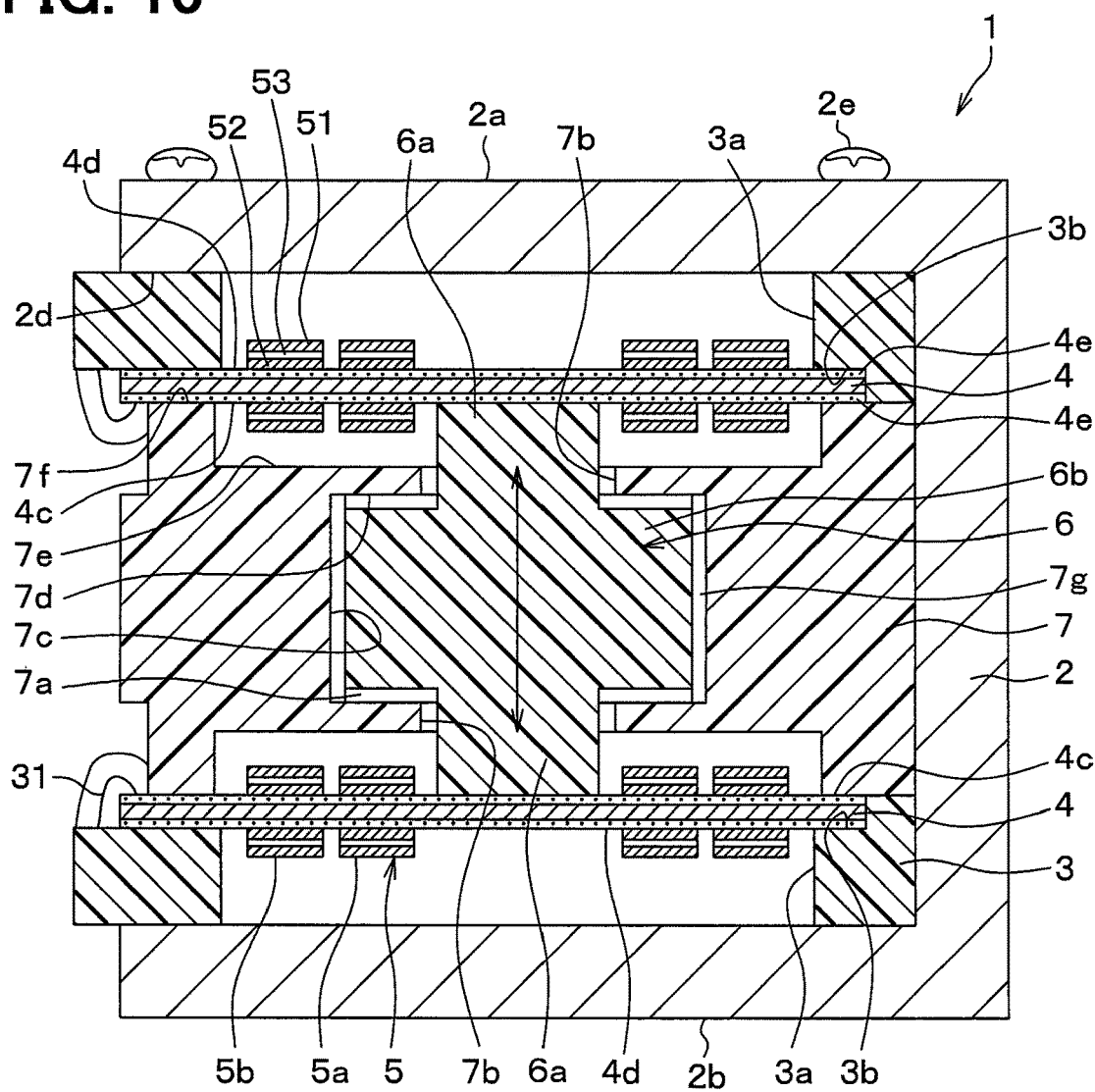
FIG. 10 is a sectional view of a power generation device according to a fifth embodiment.
Figure 11:
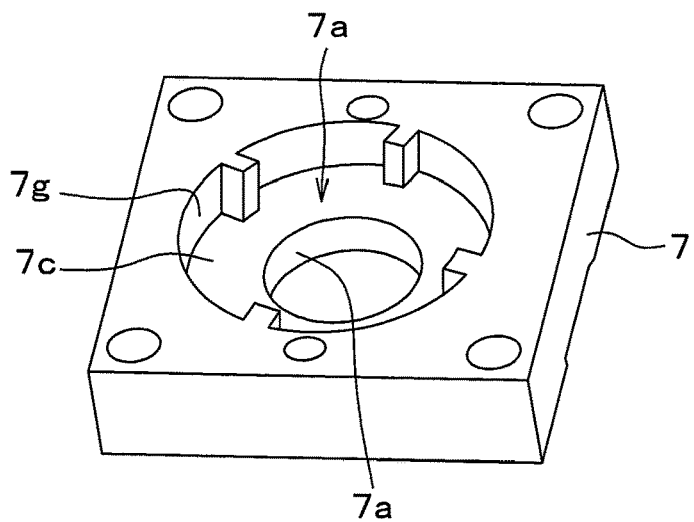
FIG. 11 is an exploded perspective view of a guide portion included in the power generation device illustrated in FIG. 10.

As illustrated in FIGS. 10 and 11, in the present embodiment, a guide portion 7 is provided with a hollow expansion portion 7c having a portion partially increased in radial dimension to form a communication passage 7g composed of a groove along an axial direction. In the present embodiment, a plurality of communication passages 7g are formed to be rotational symmetry about a center axis of a hollow portion 7a.

As described above, the guide portion 7 can be provided with the communication passages 7g. Even the structure as described above enables achieving a similar effect to that of the fourth embodiment.

Other Embodiments

While the present disclosure is described according to the embodiments described above, the present disclosure is not limited to the embodiments, and thus includes various modifications and modifications with in an equivalent range. In addition, various combinations and forms, and other combinations and forms, including only one element of the various combinations and forms, more elements thereof, or less elements thereof, are included in the category and the idea of the present disclosure.

For example, the embodiments described above are not independent of one another, and can be appropriately combined except a case where a combination is apparently impossible. While the number of components, a numeric value, an amount, and a numeric value of a range or the like, are sometimes described in each of the embodiments described above, the values each are not limited to a specific number except a case of being specified to be particularly indispensable, a case of being apparently limited to a specific number in principle, and the like. Likewise, while a shape, a positional relationship, and the like, of a component and the like are sometimes described in each of the embodiments described above, the present disclosure is not limited to the shape, the positional relationship, and the like except a case of being particularly specified, a case of being limited to a specific shape, a positional relationship, or the like in principle, and the like.

For example, the beam portions 4 having the piezoelectric elements 5 sandwich the weight portion 6 in each of the embodiments described above. This is because two beam portions 4 are vibrated by vibration of one weight portion 6 to increase power generation efficiency. Thus, the beam portion 4 and piezoelectric elements 5 may be disposed on one of the protrusions 6a of the weight portion 6. In addition, while the piezoelectric elements 5 are provided on both the one surface 4c and the other surface 4d of the beam portion 4, the piezoelectric elements 5 may be provided on at least one of the surfaces.

In addition, while the weight portion 6 is composed of a member provided with the protrusion 6a in a quadrangular prismatic shape and the expansion portion 6b in a cylindrical columnar shape, the protrusion 6a and the expansion portion 6b each may have an appropriate shape. For example, the protrusion 6a may be in a polygonal columnar shape other than the quadrangular prismatic shape, in a cylindrical columnar shape, in an elliptic cylindrical columnar shape, or the like. The expansion portion 6b also may be in an elliptic cylindrical columnar shape, in a polygonal columnar shape, or the like other than the cylindrical columnar shape.

In the fourth embodiment, while the communication passage 6d is composed of the groove formed in the lateral surface of the expansion portion 6b, the expansion portion 6b may be composed of a through hole passing through the expansion portion 6b in the axial direction.

The fourth embodiment and the fifth embodiment may be combined to form the communication passage 6d and the communication passage 7g in the weight portion 6 and the guide portion 7, respectively.

The invention claimed is:

1. A power generation device comprising:
   a weight configured to vibrate in one direction as an axial direction in response to an external vibration;
   a beam arranged in at least one side with respect to the weight in the axial direction of the weight, having a plate shape, and configured to vibrate together with the weight;
   a piezoelectric element mounted on the beam, and deformable in response to a deformation of the beam to generate electric power;
   a guide, which is opposed to a first surface of the beam, including a hollow that houses the weight, the first surface opposed to the weight, and the hollow guiding a movement of the weight in the axial direction;
   a stopper included in the weight, and configured to restrict an amount of the movement of the weight in the axial direction within a predetermined amount; and
   a stopper wall configured to stop the movement of the weight in the axial direction by contacting with the stopper;
   wherein:
      the weight includes a plurality of protrusions and an expansion portion;
      at least one of the plurality of protrusions is arranged on each end of the weight in the axial direction;
      the expansion portion is arranged between two of the plurality of protrusions arranged on both ends of the weight in the axial direction;
      a diameter of the expansion portion is larger than a diameter of each of the plurality of protrusions;
      the stopper wall is included in the guide; and
      the expansion portion serves as the stopper, and the stopper wall stops the movement of the weight in the axial direction by contacting with the expansion portion.

2. The power generation device according to claim 1, wherein
   the piezoelectric element is arranged on the first surface of the beam; and
   a clearance between the stopper and the stopper wall is smaller than a clearance between the piezoelectric element and the guide.

3. The power generation device according to claim 1, wherein
   the beam is arranged in each side with respect to the weight in the axial direction.

4. The power generation device according to claim 1, wherein:
   the beam has a lattice shape including a cross support and a quadrangular frame;
   the cross support has a cross shape, and the quadrangular frame encloses the cross support;
   the weight is in contact with a center of the cross support; and
   the piezoelectric element is arranged in a periphery of the center of the cross support.

5. The power generation device according to claim 1, wherein
   the weight, the guide, or both the weight and the guide include a communicating passage, and the communicating passage communicates both spaces in the hollow which sandwich the expansion portion.

6. A power generation device comprising;
   a weight configured to vibrate in one direction as an axial direction in response to an external vibration;
   a beam arranged in at least one side with respect to the weight in the axial direction of the weight, having a plate shape, and configured to vibrate together with the weight;
   a piezoelectric element mounted on the beam, and deformable in response to a deformation of the beam to generate electric power;
   a guide, which is opposed to a first surface of the beam, including a hollow that houses the weight, the first surface opposed to the weight, and the hollow guiding a movement of the weight in the axial direction;
   a stopper included in the weight, and configured to restrict an amount of the movement of the weight in the axial direction within a predetermined amount; and
   a stopper wall configured to stop the movement of the weight in the axial direction by contacting with the stopper;
   a package configured to include a housing chamber that houses the weight, the beam, the piezoelectric element, the guide, and the stopper,
   wherein:
      the weight includes a plurality of protrusions and an expansion portion;
      at least one of the plurality of protrusions is arranged on each end of the weight in the axial direction;
      the expansion portion is arranged between two of the plurality of protrusions arranged on both ends of the weight in the axial direction and a diameter of the expansion portion is larger than a diameter of each of the plurality of protrusions;
      the expansion portion includes the stopper;
      the stopper protrudes from the weight to be closer to an inner wall surface of the package than the beam; and
      the inner wall surface of the package serves as the stopper wall, and stops the movement of the weight in the axial direction by contacting with an end of the stopper.

7. The power generation device according to claim 6, wherein
   the piezoelectric element is arranged on the first surface of the beam; and
   a clearance between the stopper and the stopper wall is smaller than a clearance between the piezoelectric element and the guide.

8. The power generation device according to claim 6, wherein
   the beam is arranged in each side with respect to the weight in the axial direction.

9. The power generation device according to claim 6, wherein:
- the beam has a lattice shape including a cross support and a quadrangular frame;
- the cross support has a cross shape, and the quadrangular frame encloses the cross support;
- the weight is in contact with a center of the cross support; and
- the piezoelectric element is arranged in a periphery of the center of the cross support.

10. The power generation device according to claim 6, wherein
- the weight, the guide, or both the weight and the guide include a communicating passage, and the communicating passage communicates both spaces in the hollow which sandwich the expansion portion.

\* \* \* \* \*